United States Patent
Nishimoto et al.

(10) Patent No.: US 8,443,863 B2
(45) Date of Patent: May 21, 2013

(54) HIGH TEMPERATURE SHEET HANDLING SYSTEM AND METHODS

(75) Inventors: Michael Yoshiya Nishimoto, Painted Post, NY (US); William Edward Lock, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 492 days.

(21) Appl. No.: 12/256,865

(22) Filed: Oct. 23, 2008

(65) Prior Publication Data

US 2010/0104402 A1 Apr. 29, 2010

(51) Int. Cl.
*B32B 38/10* (2006.01)
(52) U.S. Cl.
USPC ........... 156/757; 156/707; 156/708; 156/755; 156/758; 271/97; 271/98
(58) Field of Classification Search
None
See application file for complete search history.

(56) References Cited

U.S. PATENT DOCUMENTS

| | | | | |
|---|---|---|---|---|
| 5,080,549 | A | 1/1992 | Goodwin et al. | 414/744.8 |
| 6,072,157 | A * | 6/2000 | Klebanoff et al. | 219/228 |
| 6,242,718 | B1 | 6/2001 | Ferro et al. | 219/405 |
| 7,176,528 | B2 | 2/2007 | Couillard et al. | 257/347 |
| 2004/0092128 | A1 * | 5/2004 | Grant et al. | 438/745 |
| 2004/0140176 | A1 | 7/2004 | Inoue | 198/441 |
| 2004/0187280 | A1 | 9/2004 | Baba | 29/25.01 |
| 2006/0042315 | A1 * | 3/2006 | Chang et al. | 65/25.3 |
| 2007/0117354 | A1 | 5/2007 | Gadkaree et al. | 438/478 |
| 2008/0025835 | A1 | 1/2008 | Liljeroos | 414/804 |
| 2009/0087932 | A1 * | 4/2009 | Kondoh | 438/30 |

FOREIGN PATENT DOCUMENTS

| | | |
|---|---|---|
| EP | 0277683 A2 | 1/1988 |
| EP | 0999578 A2 | 5/2000 |
| EP | 1722410 A1 | 11/2006 |
| JP | 11188682 | 7/1999 |
| WO | WO2007/027436 A2 | 3/2007 |
| WO | WO2008/087796 A1 | 7/2008 |

* cited by examiner

*Primary Examiner* — Philip Tucker
*Assistant Examiner* — Nickolas Harm
(74) *Attorney, Agent, or Firm* — Bruce P. Watson

(57) ABSTRACT

Methods and apparatus provide for imparting a controlled supply of gas to at least one Bernoulli chuck to provide a balanced draw and repellant gas flow to a material sheet; and at least one of: elevating a temperature of the supply of gas to the at least one Bernoulli chuck such that the gas flow to the material sheet is provided at the elevated temperature providing a stream of gas to an insulator substrate to promote separation of an exfoliation layer from a donor semiconductor wafer, and providing a stream of gas to a junction of the insulator substrate and any support structure to promote separation of the insulator substrate and the supporting structure.

14 Claims, 8 Drawing Sheets

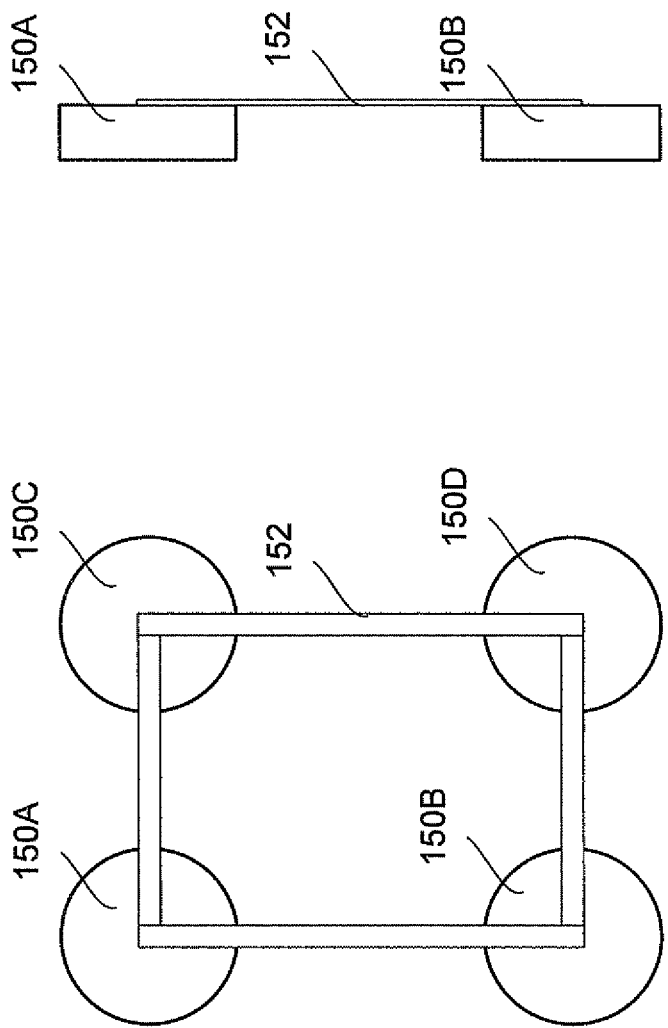

HIGH TEMPERATURE SHEET HANDLING SYSTEM AND METHODS

BACKGROUND

The present invention relates to the manufacture and handling of relatively large sheets of material and/or structures, such as semiconductor-on-insulator (SOI) structures.

Semiconductor on insulator devices are becoming more desirable as market demands continue to increase. SOI technology is becoming increasingly important for high performance thin film transistors (TFTs), solar cells, and displays, such as, active matrix displays, organic light-emitting diode (OLED) displays, liquid crystal displays (LCDs), integrated circuits, photovoltaic devices, etc. SOI structures may include a thin layer of semiconductor material, such as silicon, on an insulating material.

Various ways of obtaining SOI structures include epitaxial growth of silicon (Si) on lattice matched substrates, and bonding a single crystal silicon wafer to another silicon wafer. Further methods include ion-implantation techniques in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

U.S. Pat. No. 7,176,528 discloses a process that produces an SOG (semiconductor on glass) structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) separating the glass substrate and a thin layer of silicon from the silicon wafer.

The above manufacturing process as well as additional pre-bonding and post binding processes require that the semiconductor wafers, intermediate structures, the initial SOI structures, and the final application specific structures (such as displays, etc.) be moved among a number of fabrication stations and/or machines. In some instances, it is required or desirable to transport or otherwise physically move the structures at elevated temperatures. In the case of moving SOI structures, particularly at temperature, great care must be taken to ensure that the semiconductor material and the insulator substrate (e.g., glass or glass ceramic) is not damaged or contaminated, e.g., by warping, sagging, and/or glass breakage. The challenges associated with careful handling of the SOI structures is exacerbated as the size of the SOI structure increases, such as is experienced when large sheets of glass substrates are covered by multiple semiconductor layers in a tiling arrangement. (Large area SOI structures are described in detail in, for example, U.S. Application Publication No. 2007/0117354, the entire disclosure of which is incorporated herein in its entirety.)

As mechanical transport devices, such as rollers, suction cups, metal grippers, etc. are not suitable for transporting SOI structures due to the potential for contamination and the high temperatures involved, a class of pickup devices, known as Bernoulli wands, has been employed for transporting very hot semiconductor wafers. Bernoulli wands (e.g., formed of quartz) are useful for transporting semiconductors wafers between high temperature chambers. The advantage provided by the Bernoulli wand is that the hot semiconductor wafer generally does not contact the pickup wand, except perhaps at one or more small locators positioned outside the wafer edge on the underside of the wand, thereby minimizing contact damage to the wafer caused by the wand. Bernoulli wands for high temperature wafer handling are disclosed in U.S. Pat. No. 5,080,549; U.S. Pat. No. 6,242,718; and U.S. Application Publication No. 2008/0025835, the entire disclosures of which are hereby incorporated herein by reference.

When positioned above a semiconductor wafer, the Bernoulli wand uses jets of gas to create a gas flow pattern above the semiconductor wafer that causes the pressure immediately above the semiconductor wafer to be less than the pressure immediately below the semiconductor wafer. Consequently, the pressure imbalance causes the semiconductor wafer to experience an upward "lift" force. Moreover, as the semiconductor wafer is drawn upward toward the wand, the same jets that produce the lift force produce an increasingly larger repulsive force that prevents the semiconductor wafer from contacting the Bernoulli wand. As a result, it is possible to suspend the semiconductor wafer below the wand in a substantially non-contacting manner.

Although the use of the Bernoulli wand has been helpful in transporting relatively small sized semiconductor wafers (e.g., in the 200-300 mm diameter range), the conventional usages of same are not suited to handling and transport of larger area SOI structures. Indeed, as the area of the SOI structure increases the use of conventional Bernoulli wand technology may still result in excessive warping, sagging, and/or glass breakage. Even relatively small area SOI structures may experience unnecessarily high curling and/or warping due to significant temperature gradients that occur when hot SOI structures are subject to the gas flow patterns of the conventional Bernoulli wand. Thus, in some manufacturing processes, such as the aforementioned anodic bonding process to form an SOI structure, an operator must wait for an SOI structure to cool significantly before subjecting the structure to transport via Bernoulli wand.

Accordingly, there is a need in the art for new methods and apparatus for handling sheet material (such as SOI structures), particularly at elevated temperatures.

SUMMARY

For ease of presentation, the following discussion will at times be in terms of SOI structures. The references to this particular type of SOI structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SOI abbreviation is used to refer to semiconductor-on-glass structures in general, including, but not limited to, silicon-on-glass structures. The abbreviation SOI encompasses SiOG structures.

In accordance with one or more embodiments of the present invention, a material sheet handling apparatus includes: at least one Bernoulli chuck operable to impart a balanced draw and repellant gas flow to the material sheet in response to a controlled supply of gas. For example, the at least one Bernoulli chuck may be operable to impart a balanced draw and repellant gas flow to a first surface of a donor semiconductor wafer of a semiconductor on insulator structure, where a second surface of the donor semiconductor wafer is coupled to an insulator substrate, and the donor semiconductor wafer includes a weakened region defining an exfoliation layer between the weakened region and the second surface.

In accordance with one or more embodiments, the material sheet handling apparatus may further include a gas temperature regulator coupled to the at least one Bernoulli chuck such that the supply of gas thereto is provided at an elevated temperature. For example, the gas temperature regulator may provide the supply of gas to the at least one Bernoulli chuck at a temperature between about 100° C. to 1000° C., between about 500 to 700° C.; and/or at a temperature substantially matching a temperature of the material sheet prior to imparting the gas flow. The material sheet handling apparatus may include a controller operable to program the gas temperature regulator to provide the supply of gas to the at least one Bernoulli chuck at the elevated temperature.

The material sheet may be a semiconductor on insulator structure including a plurality of semiconductor tiles coupled to an insulator substrate; and at least one Bernoulli chuck may be positioned to impart a balanced draw and repellant gas flow to each of the semiconductor tiles.

The material sheet handling apparatus may alternatively or additionally include at least one gas jet located proximate to a junction of the donor semiconductor wafer and the insulator substrate, where the at least one gas jet is operable to impart a stream of gas to the insulator substrate to promote separation of the exfoliation layer from the donor semiconductor wafer. For example, the at least one gas jet may be located at a corner of the semiconductor on insulator structure. If the semiconductor on insulator structure includes a plurality of semiconductor tiles coupled to the insulator substrate, then the at least one gas jet may be located proximate to a junction of each of the semiconductor tiles and the insulator substrate. The material sheet handling apparatus may further include a controller operable to program the controlled supply of gas to the at least one Bernoulli chuck and to program a source of gas to the at least one gas jet.

The material sheet handling apparatus may alternatively or additionally include at least one further gas jet located proximate to a junction of the insulator substrate and any support structure, and the at least one gas jet may be operable to impart a stream of gas to the junction to promote separation of the insulator substrate and the supporting structure. By way of example, the at least one further gas jet may be located at a corner of the insulator substrate.

Methods of handling the work piece, such as the aforementioned material sheet (e.g., a semiconductor on insulator structure) follow in view of the above-described apparatus.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIGS. 7A and 7B illustrate a top plan view and a side view, respectively, of an array of Bernoulli chucks suitable for handling an SOI structure, such as the SOI structure of FIG. 2;

DETAILED DESCRIPTION

Figure 1:
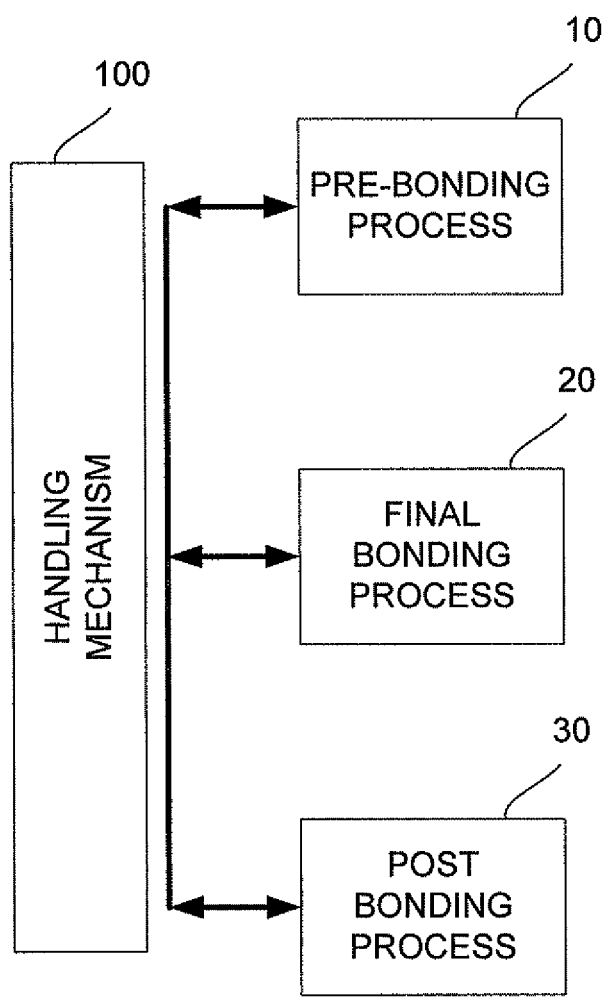
FIG. 1 is a block diagram illustrating a generalized SOI manufacturing process and handling mechanism for same in accordance with one or more embodiments of the present invention.

With reference to the drawings, wherein like numerals indicate like elements, there is shown in FIG. 1 a system for handling and transporting a material sheet, such as an SOI structure, among a number of processing stations 10, 20, 30, using a handling mechanism 100. For the purposes of illustration, and not necessarily by way of limitation, the processes are a pre-bonding process 10, a final bonding process 20, and a post bonding process 30 in connection with the manufacture of an SOI structure (not shown).

The handling mechanism 100 must move the SOI structure during the manufacturing process among the stations/processes 10, 20, 30 (and possibly others), potentially while the SOI structure is at elevated temperatures (e.g., around 600° C. or higher). The handling mechanism 100 must provide the movement/transport function while ensuring that the semiconductor material and the insulator substrate (e.g., glass or glass ceramic) is not damaged or contaminated, e.g., by warping, sagging, scratching and/or glass breakage.

In order to appreciate the intricacies of the challenges associated with handling an SOI structure, the description of the embodiments of the invention will be provided in the context of a particular SOI type and particular manufacturing process. It is understood, however, that the invention is not limited to the handling of the particular type of SOI discussed herein, or even to an SOI, as the invention has application to material handling generally. The particular SOI structure discussed below is of the semiconductor on glass (SOG) variety, wherein the semiconductor (such as silicon) is bonded to a glass or glass-ceramic substrate by way of anodic bonding. This example has been selected for the purposes of discussion because the bonding process itself requires elevated temperatures and, thus, challenges in transporting the SOG structure and intermediate structures arise.

Reference is now made to FIGS. 1 and 2-4, which illustrate intermediate structures that may be formed, and processes that may be carried out, in order to produce a base SOG structure 101 (FIG. 4) from which an SOI device may be formed. More particularly, once fabricated, the base SOG structure 101 may be used to produce an application specific device, such as thin film transistor (TFT) devices, solar cells, displays, such as, active matrix displays, organic light-emitting diode (OLED) displays, liquid crystal displays (LCDs), integrated circuits, photovoltaic devices, etc.

Figure 2:
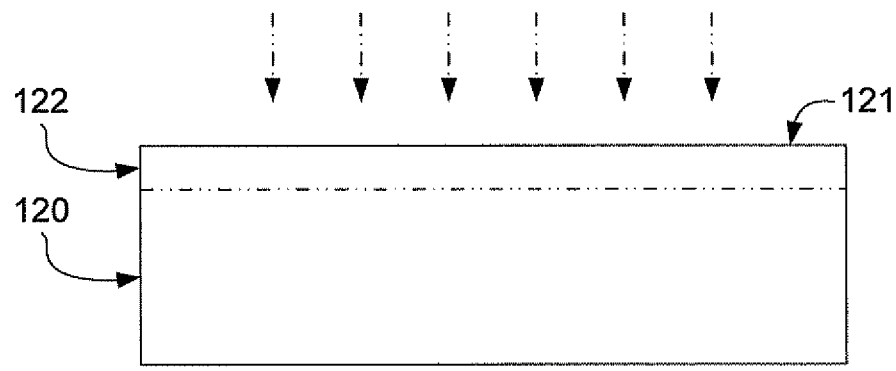
FIGS. 2-4 are block diagrams illustrating intermediate SOI structures formed using an anodic bonding process to produce a base SOI structure.

The pre-bonding process 10 (FIG. 1) may involve a number of sub-processes including, with reference to FIG. 2, ion implantation. An implantation surface 121 of a donor semiconductor wafer 120 is prepared, such as by polishing, cleaning, etc. to produce a relatively flat and uniform implantation surface 121 suitable for bonding to the glass substrate 102. For the purposes of discussion, the semiconductor wafer 120 may be a substantially single crystal silicon wafer, although as discussed above any other suitable semiconductor conductor material may be employed. An exfoliation layer 122 is created by subjecting the implantation surface 121 to one or more ion implantation processes (e.g., hydrogen ion implantation) to create a weakened region below the implantation surface 121 of the donor semiconductor wafer 120. The implantation energy may be adjusted using conventional techniques to achieve a general thickness of the exfoliation layer 122, such as between about 300-500 nm.

Figure 3:
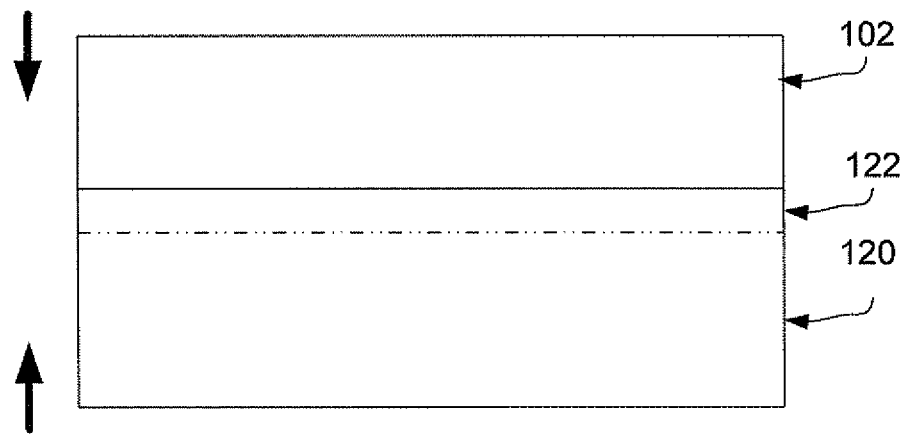

With reference to FIG. 3, the pre-bonding process 10 may also include performing appropriate surface cleaning of the glass substrate 102 and the exfoliation layer 122. Thereafter, the intermediate structures (the glass substrate 102 and the exfoliation layer 122) are brought into direct or indirect contact to achieve the arrangement schematically illustrated in FIG. 3.

In some instances, the pre-bonding process 10 may involve creating a seed bond between the glass substrate 102 and the exfoliation layer 122 prior to the final anodic bonding process 20. In this regard, a preload pressure, temperature and voltage is applied to the semiconductor wafer 120 and glass substrate 102 to initiate anodic bonding in a localized area (preferably a central area) of the interface between the semiconductor wafer 120 and the glass substrate 102.

It is noted that there may be one or more handling steps carried out by the handling mechanism 100 in connection with performing the pre-bonding process 10, and in connection with transitioning between the pre-bonding process 10 and the final bonding process 20. Again, the particularities of the handling mechanism 100 will be discussed later in this disclosure.

Figure 4:
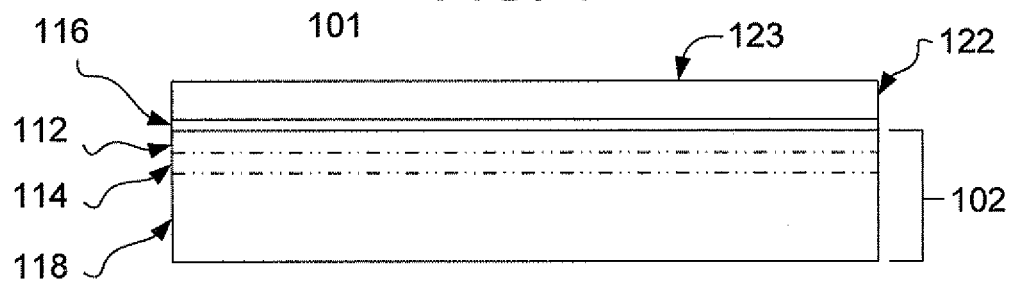

With reference to FIGS. 3-4 the glass substrate 102 may be anodically bonded to the exfoliation layer 122 using an electrolysis process. A suitable electrolysis bonding process is described in U.S. Pat. No. 7,176,528, the entire disclosure of which is hereby incorporated by reference. Portions of this process are discussed below. The donor semiconductor wafer 120, the exfoliation layer 122, and the glass substrate 102 are heated, such as under a differential temperature gradient where the glass substrate 102 is heated to a higher temperature than the donor semiconductor wafer 120 and exfoliation layer 122. The glass substrate 102 and the donor semiconductor wafer 120 may be taken to a temperature within about +/− 150 degrees C. of the strain point of the glass substrate 102, which may be greater than about 700° C. for some glass substrates 102.

Once the temperature differential between the glass substrate 102 and the donor semiconductor wafer 120 is stabilized, mechanical pressure is applied to the intermediate assembly (e.g., 1 to about 50 psi). Next, a voltage is applied across the intermediate assembly, for example with the donor semiconductor wafer 120 at the positive electrode and the glass substrate 102 the negative electrode. The intermediate assembly is held under the above conditions for some time (e.g., approximately 1 hour or less), and then the voltage and pressure are removed. The donor semiconductor wafer 120 and the glass substrate 102 must be separated to obtain a glass substrate 102 with the relatively thin exfoliation layer 122 formed of the semiconductor material of the donor semiconductor layer 120 bonded thereto (FIG. 4). The separation process will be discussed in more detail later in this description.

Again, there may be one or more handling steps carried out by the handling mechanism 100 in connection with performing the final bonding process 20, and in connection with transitioning between the final bonding process 20 and the post bonding process 30. Again, the particularities of the handling mechanism 100 will be discussed later in this disclosure.

Figure 5:
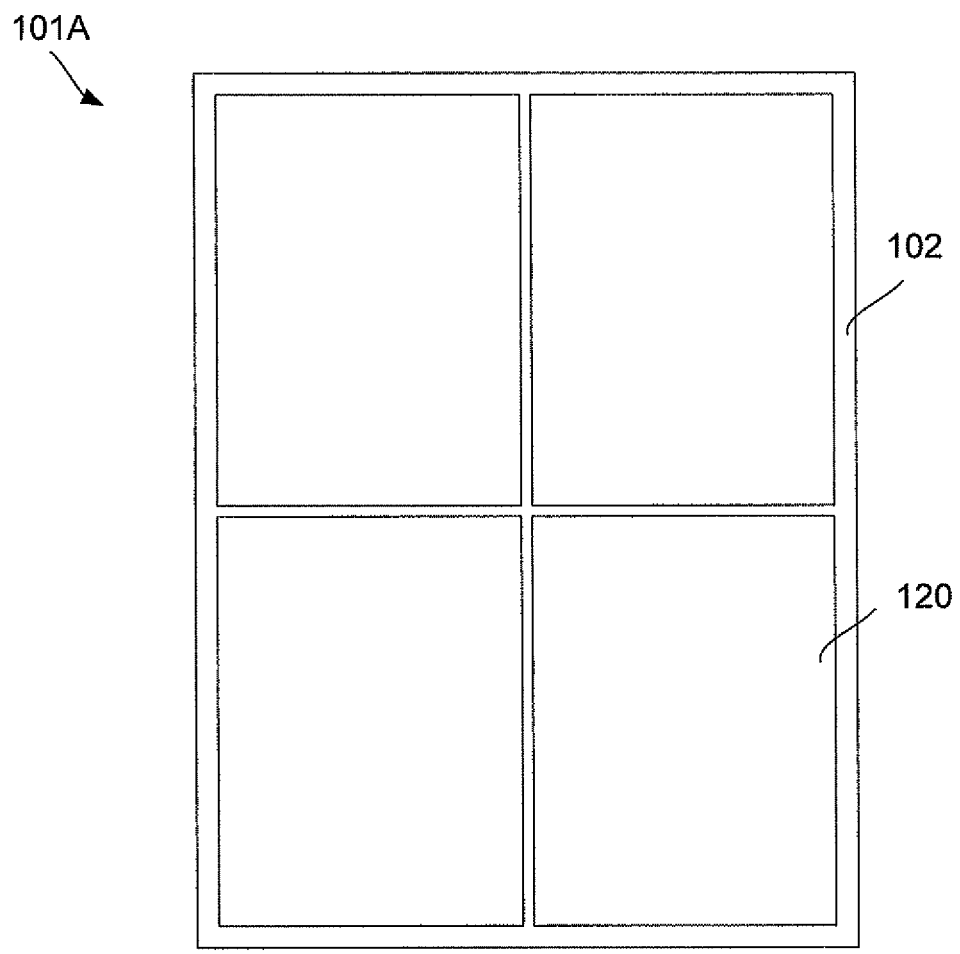
FIGS. 5-6 illustrate a top plan view and a side view, respectively, of an SOI structure employing multiple semiconductor tiles coupled to an insulator substrate.
Figure 6:
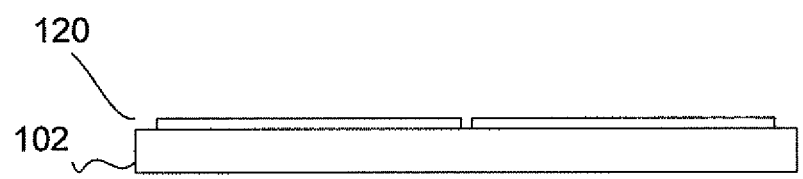

Reference is now made to FIGS. 5 and 6, which illustrate a top plan view and a side view, respectively, of an SOI structure 101A, employing multiple semiconductor tiles 120 coupled to an insulator substrate, such as a glass or glass ceramic substrate 102. The SOI structure 101A may be formed using a similar process as discussed above with respect to manufacturing the base SOI structure 101. Further details regarding the manufacturing of a tiled SOI structure 101A may be found in U.S. Application Publication No. 2007/0117354, the entire disclosure of which is hereby incorporated by reference.

With reference to FIGS. 7A and 7B, the handling mechanism 100 includes at least one, and preferably a plurality of Bernoulli chucks, 150A, 150B, 150C, 150D organized into an array. Each Bernoulli chuck 150 is operable to impart a balanced draw and repellant gas flow to the SOI structure 101A in response to a controlled supply of gas thereto. In the case of handling a relatively small SOI structure, such as SOT structure 101 (FIG. 4), then relatively few or only one Bernoulli chuck 150 need be employed. For the tiled SOI structure 101A (FIG. 5) a plurality of Bernoulli chucks, 150A, 150B, 150C, 150D, such as one chuck 150 per tile 120, may be desirable to ensure that warping, sagging, and/or glass breakage is avoided. A rigid frame 152 may be employed to ensure that the plurality of Bernoulli chucks, 150A, 150B, 150C, 150D are in good position for imparting the balanced draw and repellant gas flow to the SOI structure 101A. In a preferred embodiment, the gas flow from the Bernoulli chucks, 150A, 150B, 150C, 150D engages top surfaces of the semiconductor tiles 120.

Figure 8A:
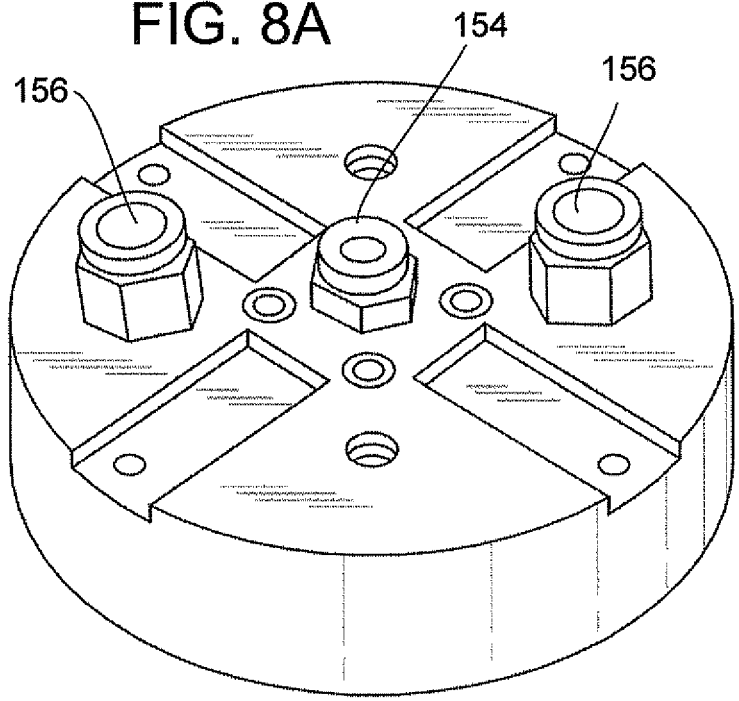
FIGS. 8A and 8B illustrate a rear view and a front view, respectively, of a Bernoulli chuck suitable for use in connection with one or more embodiments of the present invention.
Figure 8B:
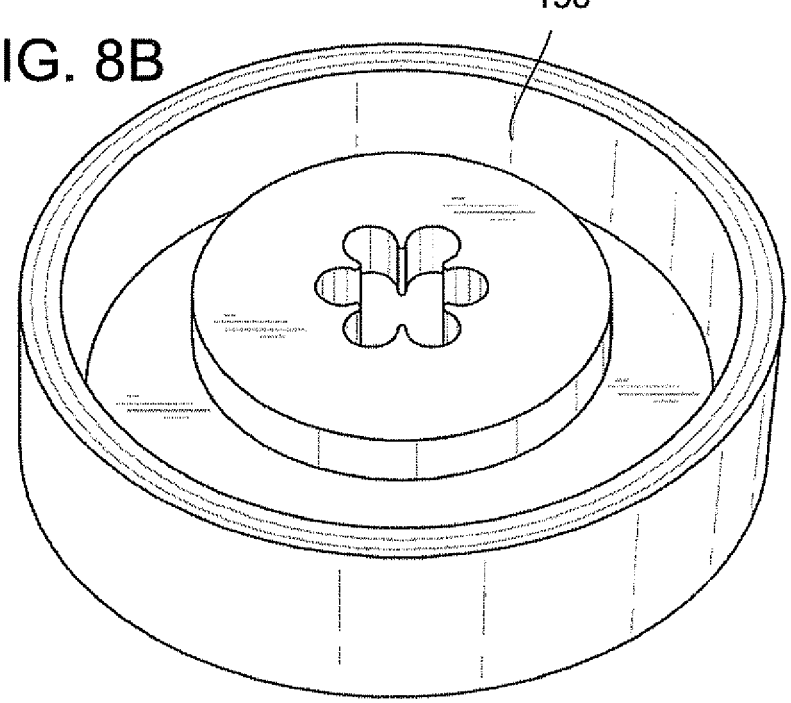

With reference to FIGS. 8A and 8B, each Bernoulli chuck 150 includes one or more gas inlets 154, one or more gas outlets (exhaust) 156, and annular gas flow apertures 158. When positioned above the semiconductor wafer 120, the Bernoulli chuck 150 establishes jets of gas to create a gas flow pattern above the semiconductor wafer 120 that causes the pressure immediately above the semiconductor wafer 120 to be less than the pressure immediately below the glass substrate 102. The pressure imbalance causes the semiconductor wafer 120 (and thus the entire SOI structure 101A) to experience an upward "lift" force. The one or more Bernoulli chucks 150 are operable to permit the SOI structure 101A to be oriented horizontally, vertically, and/or orientations therebetween. A suitable Bernoulli chuck 150 for implementing a practical device may be obtained from Solar Research Laboratory, Toyonaka-city, Osaka, Japan—part number WA-4C. The structure and control of the Bernoulli chucks 150 may be controlled such that a holding distance of between about 300 um-800 um is achieved at a holding force of about 600 gramf.

Figure 9:
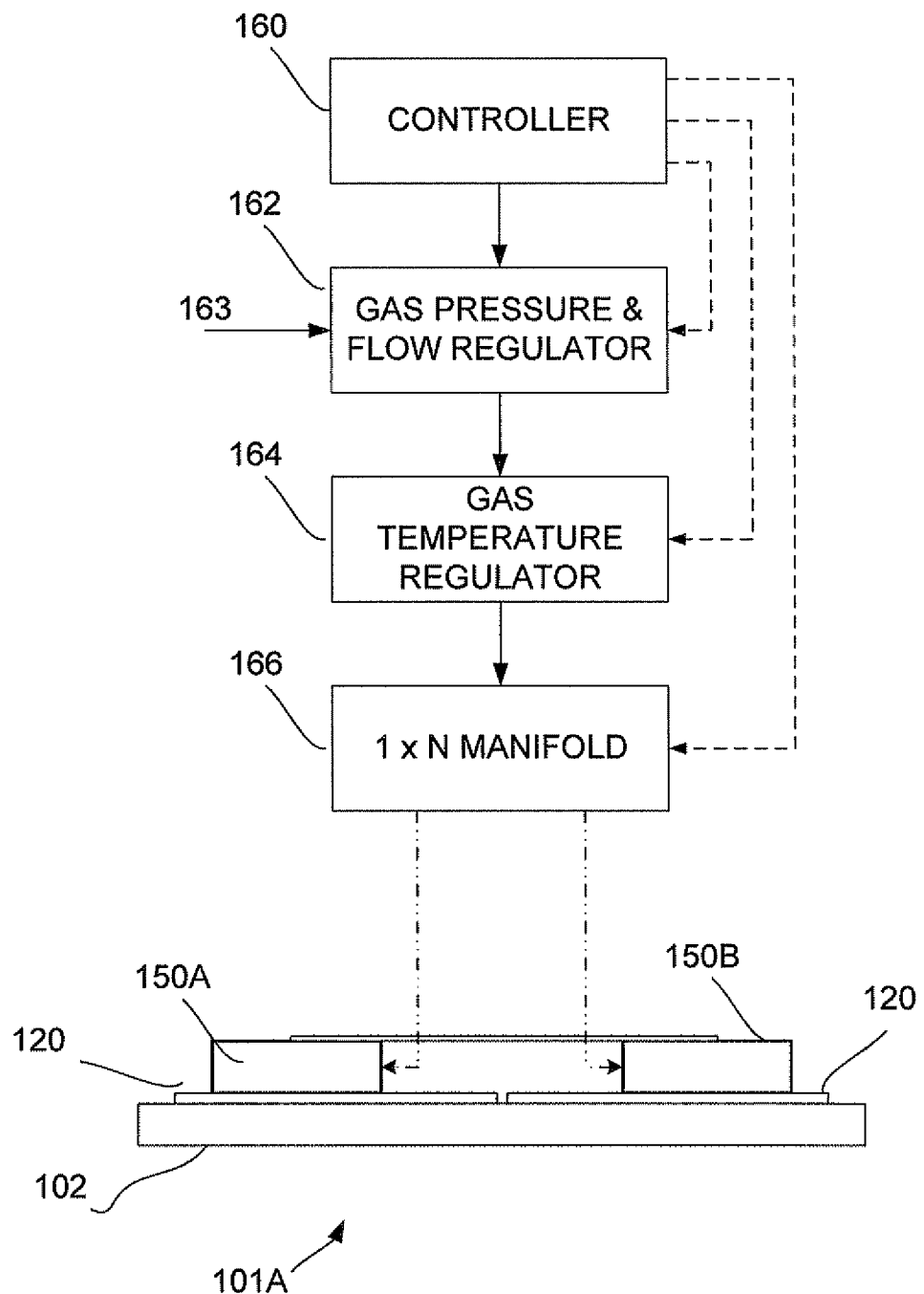
FIG. 9 is a block diagram illustrating a control system for providing a source of gas flow to at least one Bernoulli chuck in accordance with one or more embodiments of the present invention.

With reference to FIG. 9, the handling mechanism 100 may further include one or more of a controller 160, a gas pressure and flow regulator 162 for receiving and regulating a flow of gas 163 from source of gas (not shown), a gas temperature regulator 164, and a 1×N manifold 166. The controller 160 is operable to program one or more elements of the handling system 100. The controller 160 may be implemented using suitable microprocessor systems, or using any of the known, or hereinafter developed, technology. For example, the controller 160 may be coupled to the gas pressure and flow regulator 162. The gas pressure and flow regulator 162 is operable to respond to electrical commands from the controller 160 by providing a controlled supply of gas to the one or more Bernoulli chucks 150, such that the chucks 150 may provide a corresponding balanced draw and repellant gas flow to the SOI structure 101, 101A. The gas pressure and flow regulator 162 may be implemented using any of the known, or hereinafter developed, technologies.

In one or more embodiments, the gas temperature regulator 164 is coupled to the one or more Bernoulli chucks 150 such that the supply of gas thereto is provided at an elevated temperature. By way of example, the gas temperature regulator 164 may include a heater that elevates the temperature of the gas 163 sourced to the Bernoulli chucks 150 through the manifold 166. The heater may be a gas or a resistive electronic heater, or it may be any suitable known, or hereinafter developed, technology. In order to prevent the onset of temperature gradients on or within the SOI structure 101, the gas temperature regulator 164 may be programmed to provide the supply of gas to the at least one Bernoulli chuck 150 at a temperature substantially matching a temperature of the SOI structure 101, 101A prior to imparting the gas flow. For example, during any particular transfer or re-orientation of the SOI structure 101, 101A during manufacture, the SOI structure 101, 101A may have been elevated to a relatively high temperature, such as about 600° C. or more in the case of some bonding steps. The gas temperature regulator 164 may be programmed to provide the supply of gas to the at least one Bernoulli chuck 150 at such temperature of the SOI structure 101, 101A, such that the temperature of the SOI structure 101, 101A is not substantially changed as a result of the gas flow from the one or more Bernoulli chucks 150. This avoids the need to wait for the SOI structure 101, 101A to cool prior to engaging the Bernoulli chucks 150, and thereby increases manufacturing speeds and lowers manufacturing costs. By way of example, the gas temperature regulator 164 may provide the supply of gas to the Bernoulli chuck(s) 150 at a temperature between about 300 to 1000° C., and more specifically between about 500 to 700° C.

The 1×N manifold 166 may be employed to direct the source of gas to the one or more Bernoulli chuck(s) 150. Thus, in one example, when working with SOI structures 101A having for silicon tiles N may be four and the 1×4 manifold 166 would provide gas at elevated temperature to each of four Bernoulli chucks, 150A, 150B, 150C, 150D (only two of which may be seen in FIG. 9).

Figure 10:
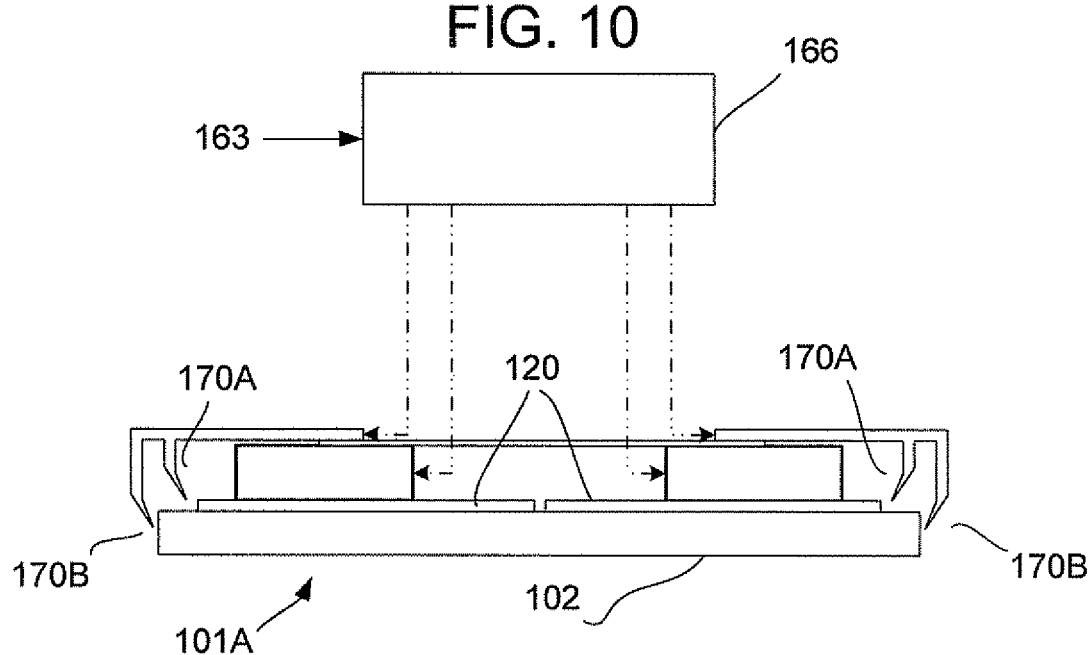
FIG. 10 is a block diagram illustrating an alternative control system for providing a further source of gas flow to separation jets in accordance with one or more embodiments of the present invention.

With reference to FIG. 10, an alternative or additional feature may be employed by the handling mechanism 100. In this embodiment, the handling mechanism 100 may or may not include the aforementioned controller 160, gas pressure and flow regulator 162, gas temperature regulator 164, and 1×N manifold 166. To the extent that this embodiment employs any of these elements, they may operate in a similar manner as previously described. In this embodiment, the handling mechanism 100 includes at least one gas jet 170A (nozzles) mounted on the frame 152 so as to be located proximate to a junction of the donor semiconductor water 120 and the glass substrate 102 when the frame is lowered to pick up the donor wafers from the substrate. The one or more gas jets 170A are operable to impart a stream of gas to the glass substrate 102 to promote removal of the donor semiconductor wafer 120 from the exfoliated, e.g. separated, exfoliation layer 122 that is bonded to the glass substrate 102. In some instances, the contact of the relatively flat exfoliation layer 122 against donor semiconductor wafer 120 may result in a vacuum condition at this junction, thereby making it difficult to lift the donor semiconductor wafer off the exfoliation layer using only the balanced draw and repellant gas flow from the Bernoulli chucks 150. Indeed, the burst of gas applied to the glass substrate 102 tends to force the donor semiconductor wafer 102 away from the glass substrate 102 (and the exfoliation layer 122 bonded thereto), so that the donor semiconductor wafer 102 may be elevated by the Bernoulli chucks 150 and removed from the SOI structure. In one example, the at least one gas jet 170A may be located at one or more corners of the semiconductor on insulator structure 101, 101A. When the semiconductor on insulator structure 101A includes a plurality of semiconductor tiles 120 coupled to the glass substrate 102, then at least one gas jet 170A may be located proximate to a junction of each of the semiconductor tiles 120 and the glass substrate 102 to promote removal of the previously separated donor wafer from the exfoliation layer bonded to the glass.

In this embodiment, the 1×N manifold 166 may be employed to direct the source of gas to the one or more Bernoulli chuck(s) 150 and to the one or more gas jets 170A. The provision of gas to the one or more gas jets 170A may also be facilitated by way of the controller 160 programming the 1×N manifold 166. The source of gas supplied to the one or more gas jets 170A may also be provided at an elevated temperature, such as between about 100° C. to 1000° C., and more specifically between about 500 to 700° C., or in any case at a temperature matching the temperature of the semiconductor on insulator structure 101, 101A.

Alternatively, or in addition, the handling mechanism 100 may include at least one gas jet 170B (nozzles) mounted on the frame 152 so as to be located proximate to a junction of the glass substrate 102 and any supporting structure, such as a table or other structure employed in one or more of the process stations 10, 20, 30, when the frame is lowered to pick up the glass substrate from the support structure. The one or more gas jets 170B are operable to impart a stream of gas to the junction to promote separation of the glass substrate 102 and the supporting structure. Indeed, in some cases, the contact of the relatively flat glass substrate 102 against a relatively flat support surface may result in a vacuum condition at the junction, thereby making it difficult to lift the semiconductor on insulator structure 101, 101A off the support structure using only the balanced draw and repellant gas flow from the Bernoulli chucks 150. The burst of gas applied to the junction of the glass substrate 102 and the support structure tends to force the glass substrate 102 away from the support structure, breaking the vacuum and permitting the Bernoulli chucks 150 to elevate and remove the semiconductor on insulator structure 101, 101A from the support structure. In one example, the at least one gas jet 170B may be mounted on the frame so as to be located at one or more corners of the semiconductor on insulator structure 101, 101A when the frame is lowered to pick up the semiconductor on insulator structure from the support structure.

Again, the 1×N manifold 166 may be employed to direct the source of gas to the one or more Bernoulli chuck(s) 150 and to the one or more gas jets 170B, also possibly with the programmed assistance of the controller 160. Additionally or alternatively, the source of gas supplied to the one or more gas jets 170B may also be provided at one or more of the elevated temperatures discussed above.

Figure 11A:
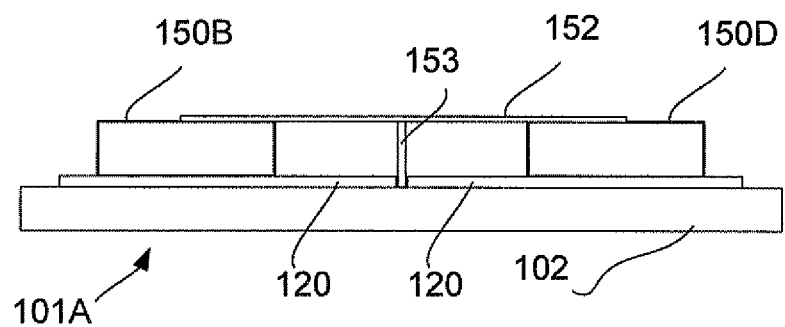
FIGS. 11A, 11B are side views of the array of Bernoulli chucks employing further features to assist in handling an SOI structure.
Figure 11B:
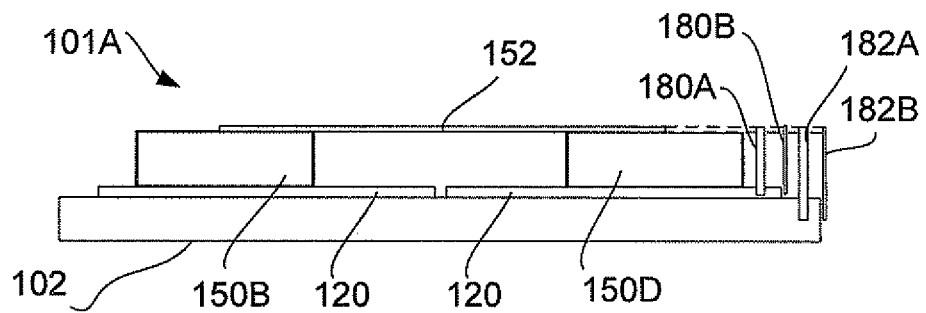

Reference is now made to FIGS. 11A, 11B, which are side views of the array of Bernoulli chucks 150 employing further features to assist in handling an SOI structure, such as the structure 101A of FIG. 5. Specifically, FIG. 11A illustrates the use of a spacer structure 153 that is operable to maintain separation of the multiple semiconductor tiles 120, especially during transport prior to being bonded to the glass substrate 120. The spacer structure 153 may depend from the rigid frame 152 and is preferably adjustable in the vertical direction such that it may penetrate into the space between the tiles 120 to a desired depth without striking and damaging the glass substrate 102. The function of the spacer structure 153 includes preventing the tiles 120 from touching each other and preventing some or all of the SOI structure 101A from moving laterally (e.g., side-to-side) relative to the Bernoulli chucks 150 prior to being placed on the glass substrate. FIG. 11A illustrates the spacer structure 153 as entering the space between only two of the tiles 120. It will be appreciated, however, that the spacer structure 153 may be designed in a "cross" configuration and be located at a central location where both spaces between all four tiles 120 converge (see FIG. 5) such that the spacer structure 153 enters the spaces between all four of the tiles 120. In the case of an array of more than 4 tiles 120, for example, arrays 2×4, 3×3, 3×4, or other array, the spacer structure may be formed in a "lattice" configuration, whereby the a portion of the lattice is located between each adjacent/facing pair of tile edges. The aforementioned spacer structures may also include "spacers" along the outer edges of the outer tiles, as well as between each tile, in order to prevent the outer tiles from moving away from adjacent tiles. The spacers 153 may form a solid lattice or T configuration, or may be in the form of partial walls or even a plurality of pins along the desired T-shape or lattice configuration.

FIG. 11B illustrates the use of retaining structures 180, 182, which operate to prevent lateral movement of the tiles 120 and the glass, respectively. The retaining structures 180, 182 may depend from the rigid frame 152 and are preferably adjustable in the vertical direction such that they may extend downward to desired degrees. Specifically, the retaining structures 180, 180 may be disposed in pairs 180A and 180B, with one retaining structure of each pair being located on either side of a corner of a given tile 120 to prevent that tile 120 from moving laterally with respect to the associated Bernoulli chuck 150. Although the retaining structures 180A, 180B are shown at only one corner of one tile 120, the retaining structures 182A, 182B may be located centrally along a corresponding edge of a tile 120, or further retaining structures 180 may be disposed at the corners of other tiles 120 to improve stability during transport. The retaining structures 182, 182 may likewise be disposed in pairs 182A and 182B, with one retaining structure of each pair being located on either side of a corner of the substrate 102 to prevent the SOI structure 101A from moving laterally during transport. Although the retaining structures 182A, 182B are shown at only one corner of the substrate 102, the retaining structures 182A, 182B may be located centrally along a corresponding edge of the glass substrate 102, or further retaining structures 182 may be disposed at other corners of the substrate 102 to improve stability.

Figure 12:
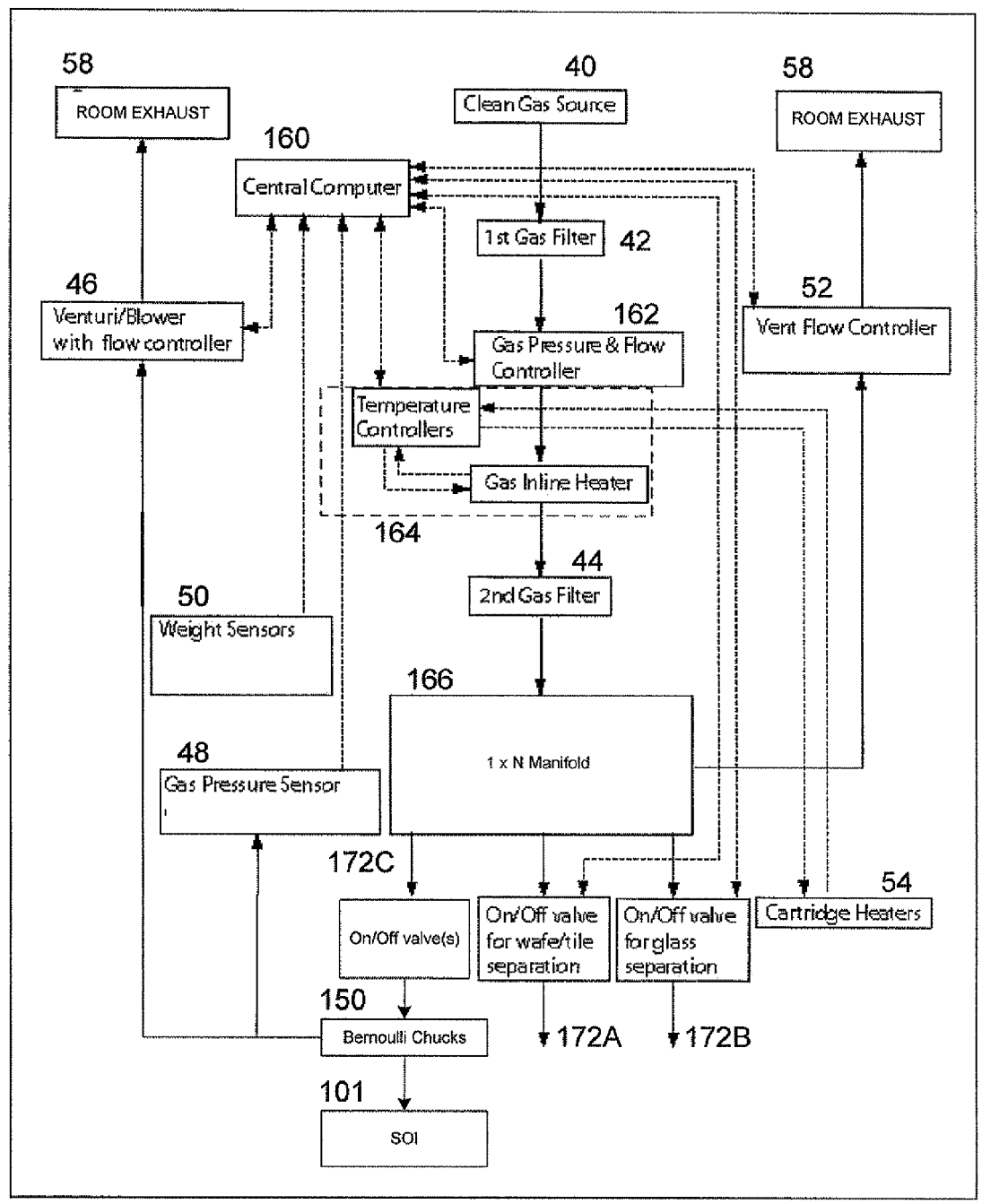
FIG. 12 is a more detailed block diagram of a control system suitable for implementing one or more embodiments of the present invention.

Reference is now made to FIG. 12, which is a more detailed block diagram of a control system suitable for implementing one or more embodiments of the present invention discussed above. The illustrated example has particular applicability when the processing and handling of the work piece (e.g., the SOI 101, 101A) is to be carried out in a clean environment. The control system may include a central computer, which includes the one or more functions discussed above with respect to the controller 160. The signal lines entering and leaving the central computer 160 are in dashed line to indicate that they are electrical signals. A source of gas, such as clean gas, is provided at element 40. One or more gas in-line filters 42, 44 may be provided between the source 40 and the 1×N manifold 166. The gas pressure and flow regulator 162 and the gas temperature regulator 164 are controlled by the central computer 160 as discussed above.

The 1×N manifold 166 is employed to direct the gas flow to the one or more Bernoulli chuck(s) 150, the one or more gas jets 170A, and/or the one or more gas jets 170B as discussed above. A gas pressure sensor system 48 may be employed to detect the engagement of the work piece (e.g., the SOI 101, 101A) by the Bernoulli chuck(s) 150. Alternatively or additionally, one or more weight sensors 50 may be employed to detect the engagement of the work piece (e.g., the SOI 101, 101A) against the support structure. One or more electronically controllable gas valves 172A, 172B may be employed in-line between the 1×N manifold 166 and the respective gas jets 170A, 170B such that the central computer 160 may program the functionality of the jets. Electronically controllable cartridge heaters 54 may alternatively or additionally be employed. The cartridge heaters 54 may be coupled to and heat the Bernoulli chucks to minimize the temperature difference between and/or substantially match the temperatures between the Bernoulli chuck 150 and the work piece (e.g., the SOI 101, 101A). Indeed, under certain conditions, the cartridge heaters 54 reduce the heat sink effect of the Bernoulli chuck 150 (which is much colder than the work piece). Without the cartridge heaters 54, the work piece might experience thermal stress or warpage.

The exhaust gas from the Bernoulli chuck(s) 150 may be directed through a chuck exhaust vent 46 (which may also include a Venturi/Blower and/or an electronically controllable flow control device), such that the exhaust gas may be channeled from the Bernoulli chucks to a room exhaust duct 58 and out of the clean environment. Alternatively or additionally the exhaust gas from the 1×N manifold 166 may be directed to a bypass exhaust vent 52 (which also may employ an electronically controllable flow control device) such that the exhaust gas from the heater may be diverted from (e.g. bypass) the Bernoulli chucks and exhausted out of the clean environment through the room exhaust. Use of the chuck exhaust vent 46 in conjunction with the bypass exhaust vent 52 is beneficial for high temperature operation, e.g., over 300° C. If there is no bypass exhaust vent 52 from the 1×N manifold 166 (or the heater 164) to the room exhaust 58, then shutting off the gas flow through the Bernoulli chucks also shuts off the gas flow through the heater. The heater 164 must then be turned off whenever the Bernoulli chucks are turned off in order to prevent the heater 164 from overheating due to the lack of gas flow through the heater. As a result, the heater cools 164 down whenever the Bernoulli chucks are turned off and the temperature air/gas being emitted from the chucks fluctuates. When the heater and the Bernoulli chuck 150 are turned back on after any significant downtime, relatively cold air is emitted from the Bernoulli chuck jet holes that may disturb the surrounding environment and warp the SOI structure or donor wafers. This temperature cycling and overshooting may also shorten the life of the heating element. Use of the chuck exhaust vent 46 in conjunction with the bypass exhaust vent 52 enables the heater 164 to maintain a constant on-state and exhibit a very stable steady state target set point temperature during operation. In a pre-heating step, the heater 164 and the gas/air flow trough the heater, the manifold 166, and the Bernoulli chucks 150 may be turned on to pre-heat the heater 164, the manifold 166 and the Bernoulli chucks 150 until a the desired steady state temperature of the gas being emitted from the chucks is achieved. When the Bernoulli chucks are turned off, the bypass exhaust vent is opened so that the air or gas may continue to flow through the heater and the manifold. In this way, the heater and the manifold are maintained at temperature while the Bernoulli chucks are tuned off and the fluctuation in the temperature of the gas emitted from the chucks when the chucks are tuned on and off is greatly reduced. The temperature fluctuation in the temperature of the gas emitted form the chucks can be reduced even further through the use of optional heaters in or on the Bernoulli chucks (such as cartridge heaters) to maintain the temperature of the Bernoulli chucks when they are turned off. Using heaters in the Bernoulli chucks also shortens the amount of time it takes to pre-heat the system. The bypass exhaust vent hole opening in manifold may be much larger than the jet hole in the Bernoulli chucks 150. In this way, when the Bernoulli chucks 150 are turned on and the bypass exhaust vent 52 may be maintained in a closed position until the 1×N manifold 166 reaches about 60 psi. At which point, the bypass exhaust vent may be partially opened to maintain the pressure in the manifold at a steady state of 60 psi. Conversely, when the Bernoulli chucks 150 are turned oft the vent flow controller is in an open position 52 allowing air to flow through bypass exhaust vent 52 to the room exhaust 58 until the 1×N manifold 166 reaches a much lower pressure.).

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A material sheet handling apparatus, comprising:
a frame supporting at least one Bernoulli chuck, at least one retaining structure, and at least one gas jet;
the at least one Bernoulli chuck, mounted to the frame to impart a balanced draw and repellant gas flow to a surface of the material sheet in response to a controlled supply of gas and thereby selectively lift and move the material sheet without contacting the material sheet with the at least one Bernoulli chuck;
the at least one retaining structure mounted either directly or indirectly to the frame to extend from the frame toward the material sheet and contact at least one edge of the material sheet and thereby prevent lateral movement of the material sheet when engaged and lifted by the at least one Bernoulli chuck;
the at least one gas jet mounted to the frame proximate to at least one edge of the material sheet to selectively impart a stream of gas to a junction of the material sheet and a support surface, when the material sheet is supported on the support surface, and thereby promote separation of the material sheet from the support surface when being lifted from the support surface by the at least one Bernoulli chuck; and
a gas temperature regulator coupled to the at least one Bernoulli chuck such that the supply of gas thereto is provided at an elevated temperature substantially matching a temperature of the material sheet prior to imparting the gas flow.

2. The material sheet handling apparatus of claim 1, wherein at least one of:
the gas temperature regulator provides the supply of gas to the at least one Bernoulli chuck at a temperature between about 100 to 1000° C.; and
the gas temperature regulator provides the supply of gas to the at least one Bernoulli chuck at a temperature between about 500 to 700° C.

3. The material sheet handling apparatus of claim 1, wherein the at least one retaining structure extends in a direction of the balanced draw and repellant gas flow of the at least one Bernoulli chuck.

4. The material sheet handling apparatus of claim 1, comprising:
wherein the at least one Bernoulli chuck is an array of Bernoulli chucks arranged on the frame to impart a balanced draw and repellant gas flow to the material sheet in response to a controlled supply of gas and thereby selectively lift and move the material sheet to and from the support surface without contacting the material sheet with the array of Bernoulli chucks;
a gas temperature regulator coupled to the array of Bernoulli chucks such that the supply of gas thereto is provided at an elevated temperature substantially matching a temperature of the material sheet prior to imparting the gas flow; and
wherein each of the material sheets is a semiconductor on insulator structure including a plurality of semiconductor tiles on an insulator substrate, and the array of Bernoulli chucks includes one Bernoulli chuck for each semiconductor tile and is arranged on the frame such that a corresponding one of the Bernoulli chucks is positioned to impart a balanced draw and repellant gas flow to a surface of a corresponding one of the semiconductor tiles and thereby selectively lift and move the semiconductor tiles to and from the insulator substrate without contacting the semiconductor tiles with the array of Bernoulli chucks.

5. The material sheet handling apparatus of claim 4, further comprising:
at least one retaining structure extends directly or indirectly from the frame to contact at least one edge of the semiconductor on insulator structure and thereby prevent lateral movement of the semiconductor on insulator structure when engaged and lifted by the balanced draw and repellant gas flow of the at least one Bernoulli chuck.

6. The material sheet handling apparatus of claim 5, wherein the at least one retaining structure extends in a direction of the balanced draw and repellant gas flow of the array of Bernoulli chucks.

7. The material sheet handling apparatus of claim 6, wherein the at least one retaining structure extends to contact at least one edge of at least one of the plurality of semiconductor tiles.

8. The material sheet handling apparatus of claim 7, wherein a distance of the at least one retaining structure extends from the frame toward the semiconductor on insulator structure is adjustable to contact at least one edge of at least one of the plurality of semiconductor tiles without contacting the insulator substrate.

9. The material sheet handling apparatus of claim 6, wherein the at least one retaining structure extends to contact at least one edge of the insulator substrate.

10. The material sheet handling apparatus of claim 9, wherein a distance of the at least one retaining structure extends from the frame toward the semiconductor on insulator structure is adjustable to contact at least one edge of the insulator substrate without contacting the support surface.

11. The material sheet handling apparatus of claim 4, further comprising:
a plurality of spacer members mounted either directly or indirectly to extend from the frame to contact at least one edge of each of the plurality of semiconductor tiles and thereby maintain separation of the plurality of semiconductor tiles during transport.

12. The material sheet handling apparatus of claim 11, comprising a plurality of said spacer members, including one spacer member for each semiconductor tile, the spacer members (i) extending from the frame in a direction of the balanced draw and repellant gas flow of the array of Bernoulli chucks, and (ii) arranged such that a corresponding one of the spacer members is positioned to contact at least one edge of a corresponding one of the plurality of semiconductor tiles.

13. The material sheet handling apparatus of claim 12, wherein the extension of the plurality of spacer members toward the semiconductor tiles is adjustable to contact the at least one edge of each of the plurality of semiconductor tiles without contacting the insulator substrate.

14. The material sheet handling apparatus of claim 1, wherein a distance that the at least one retaining structure extends from the frame toward the material sheet is adjustable so that the at least one retaining structure does not contact the support surface.

* * * * *